US012218069B2

(12) United States Patent
Aleksov et al.

(10) Patent No.: US 12,218,069 B2
(45) Date of Patent: Feb. 4, 2025

(54) MULTI-CHIP PACKAGE WITH HIGH DENSITY INTERCONNECTS

(71) Applicant: Intel Corporation, Santa Clara, CA (US)

(72) Inventors: Aleksandar Aleksov, Chandler, AZ (US); Adel A. Elsherbini, Chandler, AZ (US); Kristof Darmawikarta, Chandler, AZ (US); Robert A. May, Chandler, AZ (US); Sri Ranga Sai Boyapati, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/091,781

(22) Filed: Dec. 30, 2022

(65) Prior Publication Data

US 2023/0140389 A1    May 4, 2023

Related U.S. Application Data

(63) Continuation of application No. 17/842,600, filed on Jun. 16, 2022, now Pat. No. 11,908,802, which is a
(Continued)

(51) Int. Cl.
*H01L 23/538*    (2006.01)
*H01L 21/48*    (2006.01)
(Continued)

(52) U.S. Cl.
CPC ...... *H01L 23/5386* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS 8,716,859 B2    5/2014  Meyer
8,836,149 B2    9/2014  Son
(Continued)

OTHER PUBLICATIONS

International Search Report and Written Opinion for International Patent Application No.PCT/US2016/055023 mailed on Jun. 21, 2017.
(Continued)

*Primary Examiner* — Hung K Vu
(74) *Attorney, Agent, or Firm* — Schwabe, Williamson & Wyatt, P.C.

(57) ABSTRACT

An apparatus is provided which comprises: a plurality of first conductive contacts having a first pitch spacing on a substrate surface, a plurality of second conductive contacts having a second pitch spacing on the substrate surface, and a plurality of conductive interconnects disposed within the substrate to couple a first grouping of the plurality of second conductive contacts associated with a first die site with a first grouping of the plurality of second conductive contacts associated with a second die site and to couple a second grouping of the plurality of second conductive contacts associated with the first die site with a second grouping of the plurality of second conductive contacts associated with the second die site, wherein the conductive interconnects to couple the first groupings are present in a layer of the substrate above the conductive interconnects to couple the second groupings. Other embodiments are also disclosed and claimed.

20 Claims, 11 Drawing Sheets

Related U.S. Application Data continuation of application No. 16/904,363, filed on Jun. 17, 2020, now Pat. No. 11,393,766, which is a continuation of application No. 16/329,644, filed as application No. PCT/US2016/055023 on Sep. 30, 2016, now Pat. No. 10,727,185.

(51) Int. Cl.
| | | |
|---|---|---|
| *H01L 23/00* | (2006.01) | |
| *H01L 23/31* | (2006.01) | |
| *H01L 23/498* | (2006.01) | |
| *H01L 25/00* | (2006.01) | |
| *H01L 25/065* | (2023.01) | |
| *H01L 25/18* | (2023.01) | |
| *H01L 21/56* | (2006.01) | |

(52) U.S. Cl.
CPC .......... *H01L 23/00* (2013.01); *H01L 23/3121* (2013.01); *H01L 23/49822* (2013.01); *H01L 23/49838* (2013.01); *H01L 23/49894* (2013.01); *H01L 23/5383* (2013.01); *H01L 24/14* (2013.01); *H01L 24/16* (2013.01); *H01L 24/17* (2013.01); *H01L 24/73* (2013.01); *H01L 24/97* (2013.01); *H01L 25/0652* (2013.01); *H01L 25/0655* (2013.01); *H01L 25/18* (2013.01); *H01L 25/50* (2013.01); *H01L 21/561* (2013.01); *H01L 21/568* (2013.01); *H01L 23/5384* (2013.01); *H01L 24/13* (2013.01); *H01L 2224/1403* (2013.01); *H01L 2224/14132* (2013.01); *H01L 2224/16145* (2013.01); *H01L 2224/16225* (2013.01); *H01L 2224/16227* (2013.01); *H01L 2224/1703* (2013.01); *H01L 2224/17181* (2013.01); *H01L 2224/73204* (2013.01); *H01L 2224/81005* (2013.01); *H01L 2224/95001* (2013.01); *H01L 2224/97* (2013.01); *H01L 2924/1517* (2013.01); *H01L 2924/15192* (2013.01); *H01L 2924/15311* (2013.01); *H01L 2924/381* (2013.01)

(56) References Cited

U.S. PATENT DOCUMENTS

| | | |
|---|---|---|
| 10,727,185 B2 | 7/2020 | Aleksov |
| 11,393,766 B2 | 7/2022 | Aleksov |
| 2011/0101516 A1 | 5/2011 | Guzek |
| 2011/0241208 A1 | 10/2011 | Mahajan |
| 2014/0117552 A1 | 5/2014 | Qian |
| 2015/0102483 A1 | 4/2015 | Zhang |
| 2015/0255416 A1 | 9/2015 | Kim |
| 2015/0270209 A1* | 9/2015 | Woychik ............... H01L 21/565 257/774 |
| 2015/0318262 A1 | 11/2015 | Gu |
| 2016/0218092 A1* | 7/2016 | Chang .................. H01L 23/528 |
| 2017/0278806 A1* | 9/2017 | Kuo ....................... H01L 25/18 |
| 2019/0311983 A1 | 10/2019 | Raorane |

OTHER PUBLICATIONS

International Preliminary Report on Patentability for PCT Application No. PCT/US2016/055023, mailed Apr. 11, 2019.
Office Action from U.S. Appl. No. 17/842,600, mailed Jun. 22, 2023, 26 pgs.
Notice of Allowance from U.S. Appl. No. 17/842,600, mailed Oct. 5, 2023, 10 pgs.

* cited by examiner

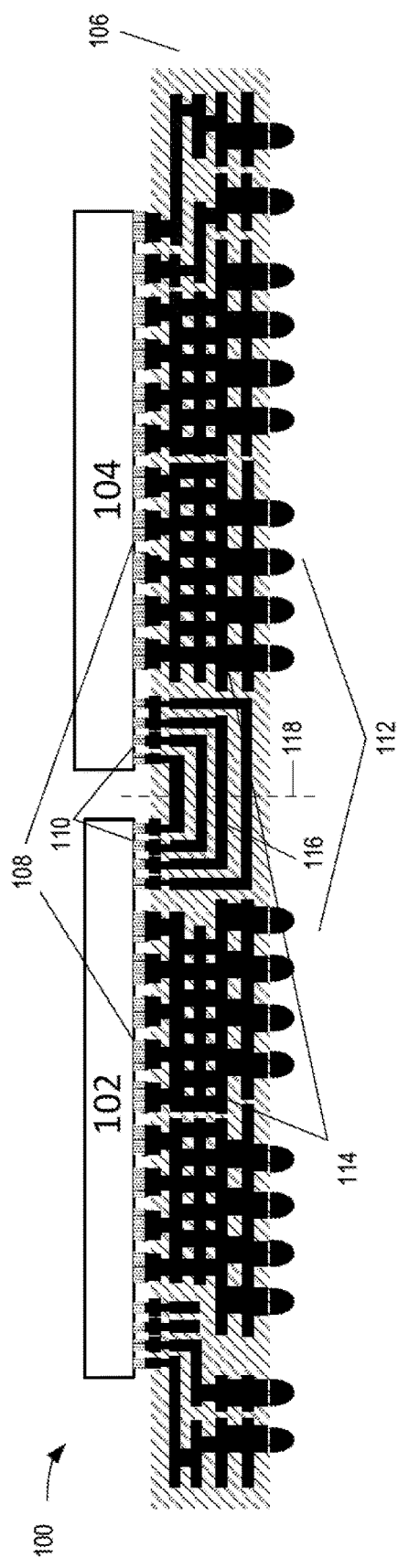
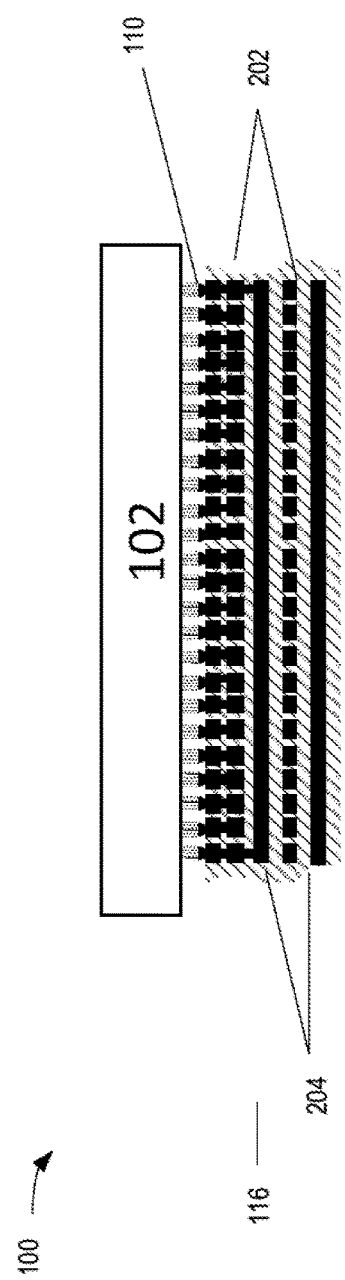
Fig. 1
Fig. 2

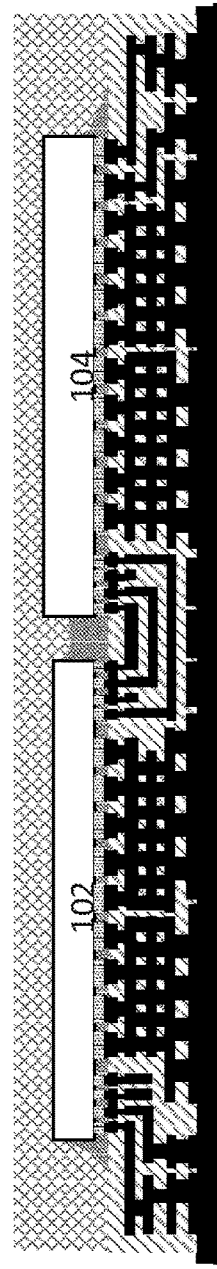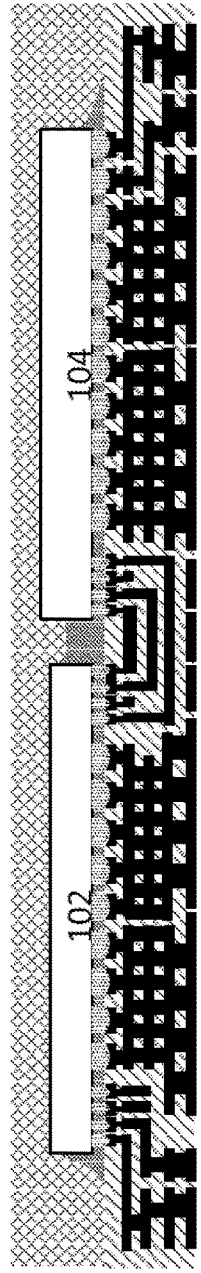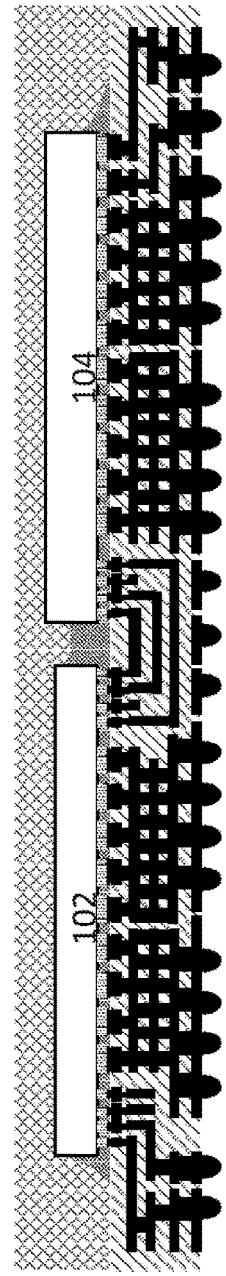

MULTI-CHIP PACKAGE WITH HIGH DENSITY INTERCONNECTS

CLAIM OF PRIORITY

This application is a continuation of U.S. patent application Ser. No. 17/842,600, filed Jun. 16, 2022, which is a continuation of U.S. patent application Ser. No. 16/904,363, filed Jun. 17, 2020, now U.S. Pat. No. 11,393,766, issued Jul. 19, 2022, which is a continuation of U.S. patent application Ser. No. 16/329,644, filed on Feb. 28, 2019, now U.S. Pat. No. 10,727,185, issued Jul. 28, 2020, which is a National Stage Entry of, and claims priority to, PCT Application No. PCT/US16/55023, filed on 30 Sep. 2016 and titled "MULTI-CHIP PACKAGE WITH HIGH DENSITY INTERCONNECTS", all of which are incorporated herein by reference in their entirety for all purposes.

BACKGROUND

System on package solutions are becoming more common because of their reduced need for printed circuit board space, thereby enabling smaller electronic devices. However, the ability to manufacture package substrates large enough to accommodate many integrated circuit devices while limiting the number of potentially harmful processes to which the devices are exposed can be challenging.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1 illustrates a cross-sectional view of a multi-chip package with high density interconnects, according to some embodiments, FIG. 2 illustrates a cross-sectional view of high density interconnects, according to some embodiments, FIG. 13 illustrates a cross-sectional view of a manufacturing step of a multi-chip package with high density interconnects, according to some embodiments, FIG. 14 illustrates a cross-sectional view of a multi-chip package with high density interconnects, according to some embodiments, FIG. 15 illustrates a cross-sectional view of a multi-chip package with high density interconnects, according to some embodiments.

DETAILED DESCRIPTION

Figure 3:
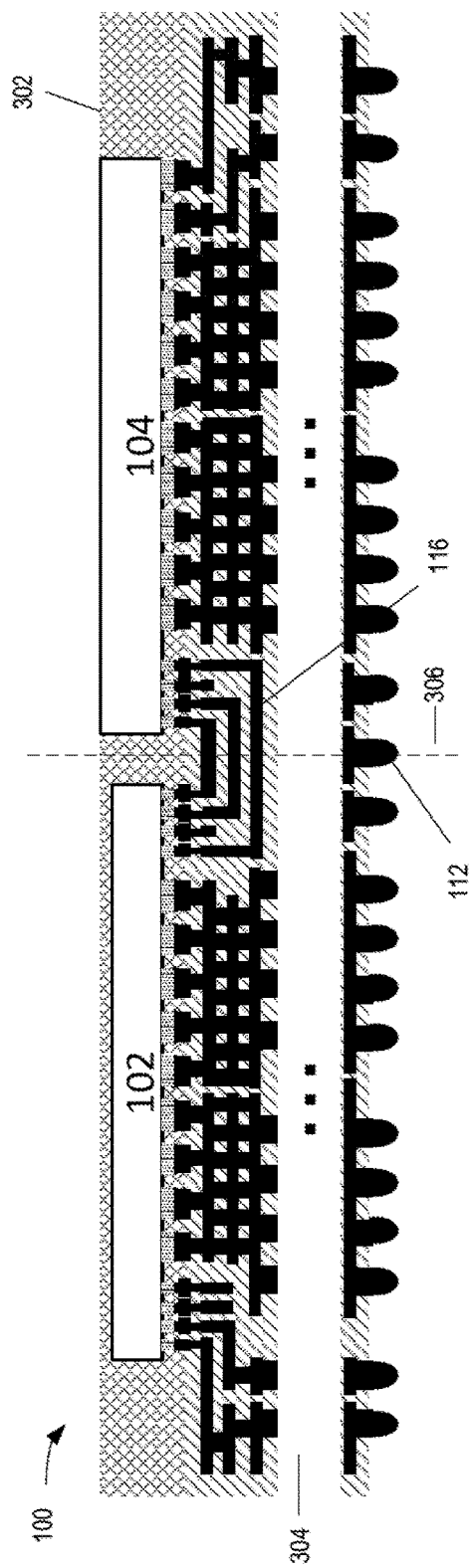
FIG. 3 illustrates a cross-sectional view of a multi-chip package with high density interconnects, according to some embodiments.

Multi-chip packages with high density interconnects are generally presented. In this regard, embodiments of the present invention enable high density interconnects between two or more die with an interconnect density of greater than about 100 IO per mm. Applications enabled by the present invention include interconnectivity to high bandwidth memory (HBM) solutions, die stitching and high bandwidth MPU or CPU/FPGA connectivity. In addition, the present invention utilizes panel-level processing which significantly reduces costs compared to the wafer level processes commonly in use today. Also, using panel-level manufacturing processes and tools primed for packaging substrates removes the reticle-size limitation of a wafer-based solution and would allow, for example, the use of full reticle die in addition to memory die in a single System on Package (SoP) configuration. A third advantageous feature of the present invention is that compared to many FanIn/Fan Out wafer-level (or panel-level) manufacturing solutions the number of process steps post placement i.e. attach of the silicon die is reduced to a minimum (and to very simple non-critical processes) and as such very costly known good die yield loss is minimized.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a cross-sectional view of a multi-chip package with high density interconnects, according to some embodiments. As shown, multi-chip package 100 includes die 102, die 104, substrate 106, coarse pitch contacts 108, fine pitch contacts 110, bottom contacts 112, interconnects 114, high density interconnects 116, and imaginary reference line 118.

Dies 102 and 104 can be of a similar type of integrated circuit devices or can be different. For example, dies 102 and 104 can be any of application processors, graphics processors, field programmable gate arrays (FPGA), input/output (I/O) controllers, network controllers, or memory devices, among other devices. Dies 102 and 104 are coupled with contacts on a top surface of substrate 106. Substrate 106 may comprise a plurality of organic dielectric layers with vertical and horizontal copper, or other conductive material, disposed therein. Dies 102 and 104 may have both coarse pitch contacts 108 and fine pitch contacts 110 that couple with corresponding coarse pitch contacts 108 and fine pitch contacts 110 on the top surface of substrate 106.

Interconnects 114 may include horizontal and vertical copper to conductively couple coarse pitch contacts 108 with bottom contacts 112. Bottom contacts 112 may have an even coarse pitch than coarse pitch contacts 108 and may comprise balls, lands, pads, or other contacts to couple with a printed circuit board, for example. High density interconnects 116 may conductively couple linearly arranged groupings of fine pitch contacts 110 between die 102 and die 104. Linearly arranged groupings of fine pitch contacts 110 may be arranged in straight lines, staggered lines, zig-zagged lines, or some other arrangement of rows. High density interconnects 116 may extend into layers below a top surface of substrate 106 directly proportional to the number of linearly arranged groupings of fine pitch contacts 110 are to be coupled between dies 102 and 104. For example, a first row of fine pitch contacts 110 along sides of dies 102 and 104 may be coupled by high density interconnects 114 through a first sub-surface layer of substrate 106. Second (next most outer) rows of fine pitch contacts 110 may be coupled by high density interconnects 114 through a second sub-surface layer of substrate 106. Third rows may be coupled through a third sub-surface layer, and so on. In this way, when viewed along imaginary reference line 118, which is orthogonal to the top surface of substrate 106, high density interconnects 116 to couple more outer rows of fine pitch contacts 110 in dies 102 and 104 may be present in substrate 106 above the high density interconnects 116 to couple more inner rows of fine pitch contacts 110 in dies 102 and 104. In other embodiments, many rows of fine pitch contacts 110 are routed through the same subsurface layer of substrate 106.

FIG. 2 illustrates a cross-sectional view of high density interconnects, according to some embodiments. As shown, multi-chip package 100 includes die 102, fine pitch contacts 110, high density interconnects 116, signal layers 202, and ground planes 204.

Embodiments of the present invention allow for the manufacturing of very high density interconnects 116 (with an interconnect density between about 100 to 300 IO/mm per layer) using fine/line spacing (less than about 10 um pitch) and vias with critical diameters (smallest dimension of equal or less than about 5 um). In some embodiments, the minimum number of metal layers anticipated to be included in high density interconnects 116 is 2, namely one signal layer 202 that carry the signals and below a layer having a ground plane 204 (typically a sheet of copper to couple many contacts together). In other embodiments, multiple signal layers 202 and/or ground planes 204 may be included. Additionally, one metal layer may be present at the first level interconnect on top of the substrate for connection to the die. The bump pitches of fine pitch contacts 110 may vary between 10 and 80 um with typical values ranging from 40 um to 60 um. The other areas of the die can have coarser pitches and features (with typical values ranging from 100 um to 150 um), however in some embodiments, die 102 can have a fine pitch area either under the entire die or fine pitches many (4-50) rows deep all around the die. Other bump configurations may also be used without deviating from the scope of the present invention.

FIG. 3 illustrates a cross-sectional view of a multi-chip package with high density interconnects, according to some embodiments. As shown, multi-chip package 100 includes die 102, die 104, bottom contacts 112, high density interconnects 116, mold compound 302, additional substrate layers 304, and imaginary reference line 306. Mold compound 302 may surround an cover dies 102 and 104 to provide additional protection and stability. Where one die has a taller height than another, mold compound 302 may not cover all dies. For example, die 102 may be covered while the top of die 104 may not be covered with mold compound 302. Additionally, mold compound 302 may initially cover dies 102 and 104 and then subsequently be removed from the top surface of either or both dies.

Additional substrate layers 304 may allow interconnects 114 to fan out bottom contacts 112 to a coarser pitch. In some embodiments, at least one bottom contact 112 is present along imaginary reference line 306 that is orthogonal to the top surface of substrate 106 and that bisects layers of high speed interconnects 116 coupling adjacent integrated circuit dies 102 and 104.

Figure 4:
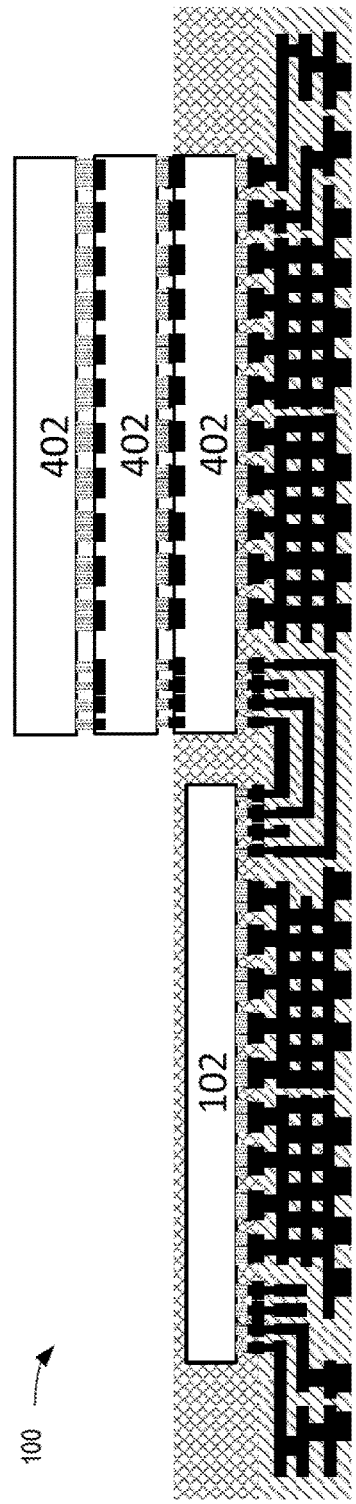
FIG. 4 illustrates a cross-sectional view of a multi-chip package with high density interconnects, according to some embodiments.

FIG. 4 illustrates a cross-sectional view of a multi-chip package with high density interconnects, according to some embodiments. As shown, multi-chip package 100 includes die 102 and stacked dies 402. Stacked dies 402 may include similar or disparate devices with top and bottom contacts designed to be stacked. In one embodiment, stacked dies 402 represent high bandwidth memory (HBM) devices while die 102 may be a processor that controls or accesses the HBM. In some embodiments, stacked dies 402 may also be covered in mold. In other embodiments, no mold is present over die 102.

Figure 5:
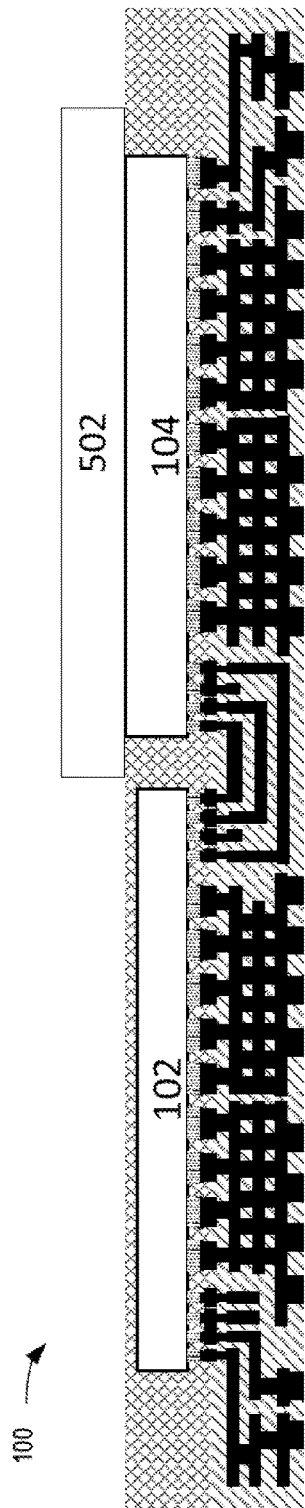
FIG. 5 illustrates a cross-sectional view of a multi-chip package with high density interconnects, according to some embodiments.

FIG. 5 illustrates a cross-sectional view of a multi-chip package with high density interconnects, according to some embodiments. As shown, multi-chip package 100 includes die 102, die 104, and thermal solution 502. Mold compound may be removed, to the extent it was present, on a top surface of die 104 to accommodate thermal solution 502. Thermal solution 502 may be a heatsink, fan, coldplate or another type of thermal solution. While shown as covering die 104, in some embodiments thermal solution 502 may multiple dies including die 102.

Figure 6:
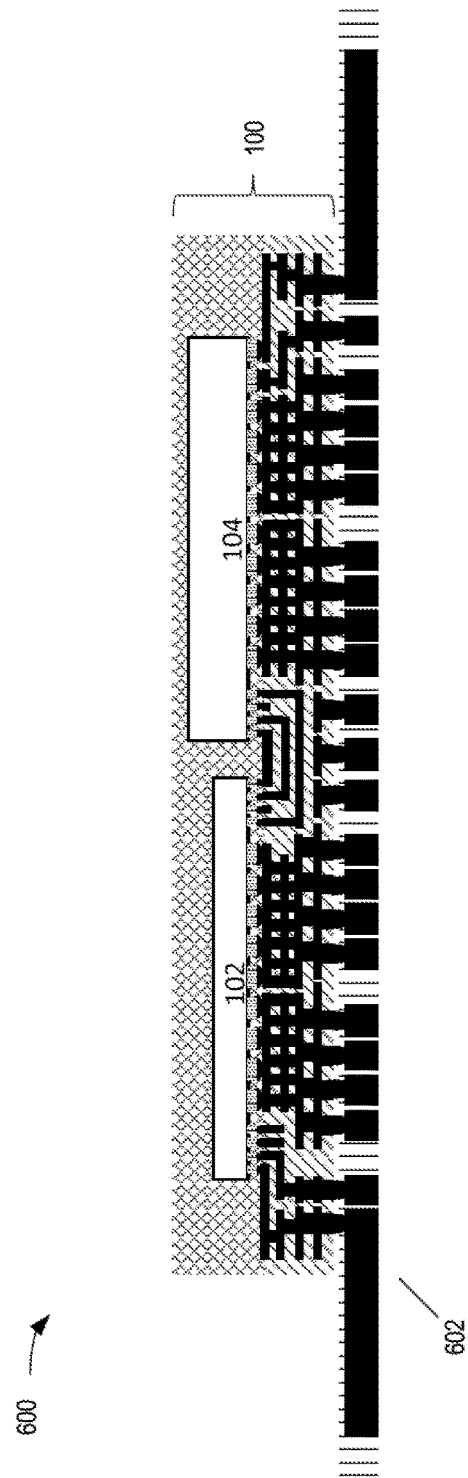
FIG. 6 illustrates a cross-sectional view of a system with a multi-chip package with high density interconnects, according to some embodiments.

FIG. 6 illustrates a cross-sectional view of a system with a multi-chip package with high density interconnects, according to some embodiments. As shown, system 600 includes multi-chip package 100 and printed circuit board 602. Printed circuit board 602 may couple multi-chip package 100 with components of system 600, for example as shown hereinafter in reference to FIG. 17.

Figure 7:
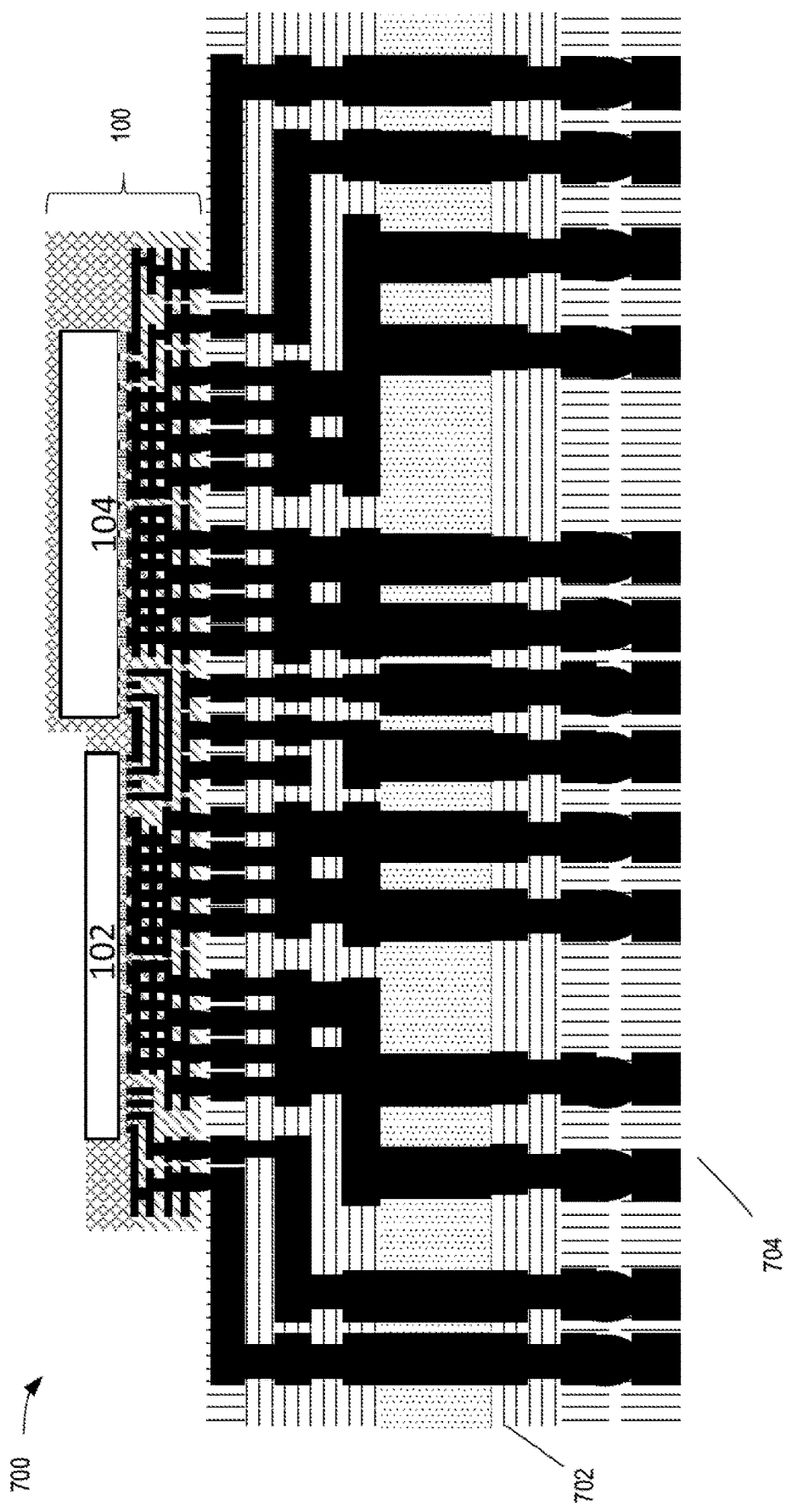
FIG. 7 illustrates a cross-sectional view of a system with a multi-chip package with high density interconnects, according to some embodiments.

FIG. 7 illustrates a cross-sectional view of a system with a multi-chip package with high density interconnects, according to some embodiments. As shown, system 700 includes multi-chip package 100, interposer 702 and printed circuit board 704. Interposer 702 may be included to fan out bottom contacts 112 of multi-chip package 100 to a greater extent and perhaps more cost effectively than by expanding substrate 106. Printed circuit board 704 may couple multi-chip package 100 with components of system 700, for example as shown hereinafter in reference to FIG. 17.

Figure 8:
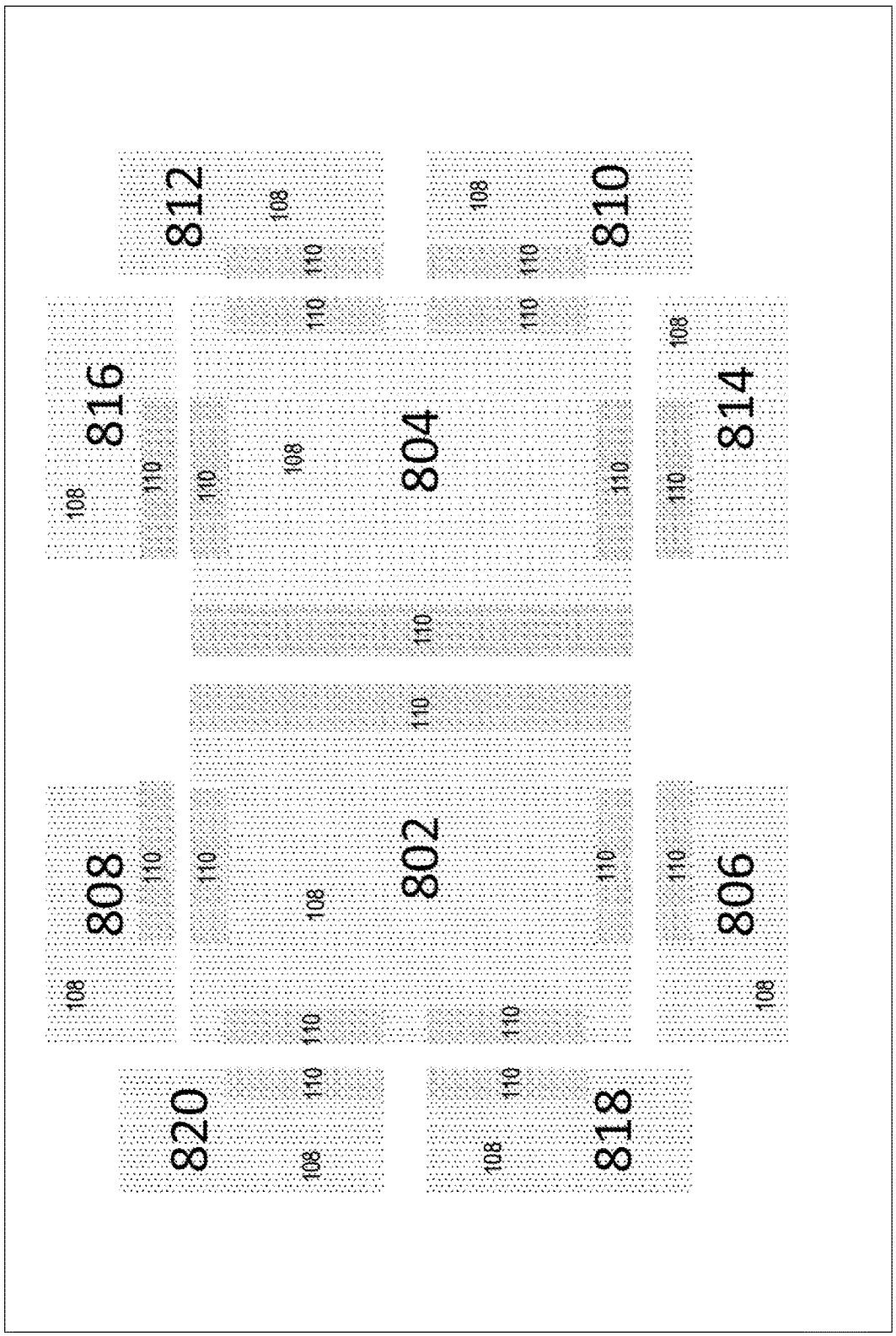
FIG. 8 illustrates an overhead view of a substrate, according to some embodiments.

FIG. 8 illustrates an overhead view of a substrate, according to some embodiments. As shown, substrate 800 includes die sites 802, 804, 806, 808, 810, 812, 814, 816, 818 and 820. Each die site may include linearly arranged groupings (for example rows) of fine pitch contacts 110 in addition to coarse pitch contacts 108. Die sites 802 and 804 may include fine pitch contacts 110 along the length of one side as part of a high density interconnect with each other. For example, die sites 802 and 804 may be designed to accept co-processors or controllers. Die sites 802 and 804 may also have multiple separate fine pitch contacts 110 on another side as part of high density interconnects with die sites 818 and 820 and dies sites 810 and 812, respectively. Die sites 806-820 may be designed to accept memory devices, possibly stacked. In some embodiments, fine pitch contacts 110 may also be included in die sites even where not part of a high density interconnect.

Figure 9:
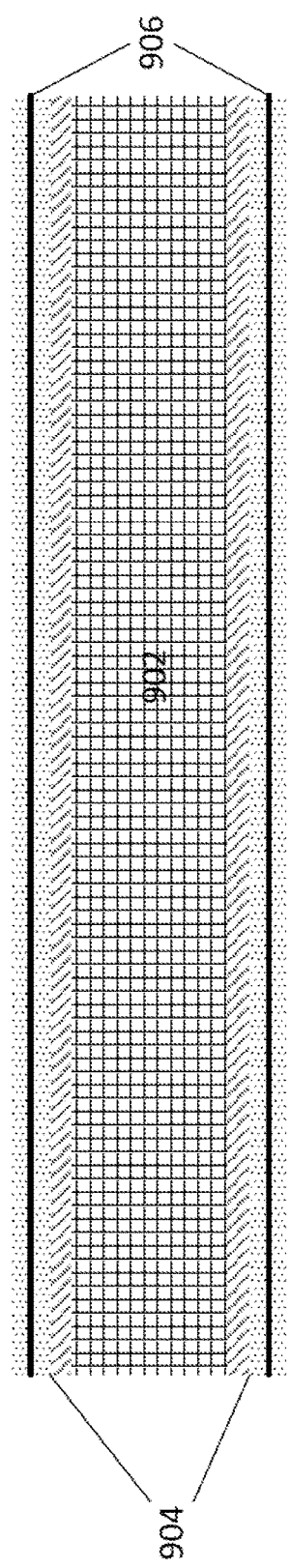
FIG. 9 illustrates a cross-sectional view of a manufacturing step of a multi-chip package with high density interconnects, according to some embodiments.

FIG. 9 illustrates a cross-sectional view of a manufacturing step of a multi-chip package with high density interconnects, according to some embodiments. As shown, peelable carrier 902 includes tacky layers 904 and sacrificial layers 906. While shown as using two sides of peelable carrier 902, in some embodiments only one side is used. Peelable carrier 902 may be reusable and may have weak tacky layers 904 that are replaceable and allow for separation of the manufactured packages. In some embodiments, tacky layers 904 may comprise a copper salt in between copper layers of peelable carrier 902 and sacrificial layers 906. In other embodiments, other materials may be used for tacky layers 904 and, in some cases, sacrificial layers 906 may not be needed.

Figure 10:
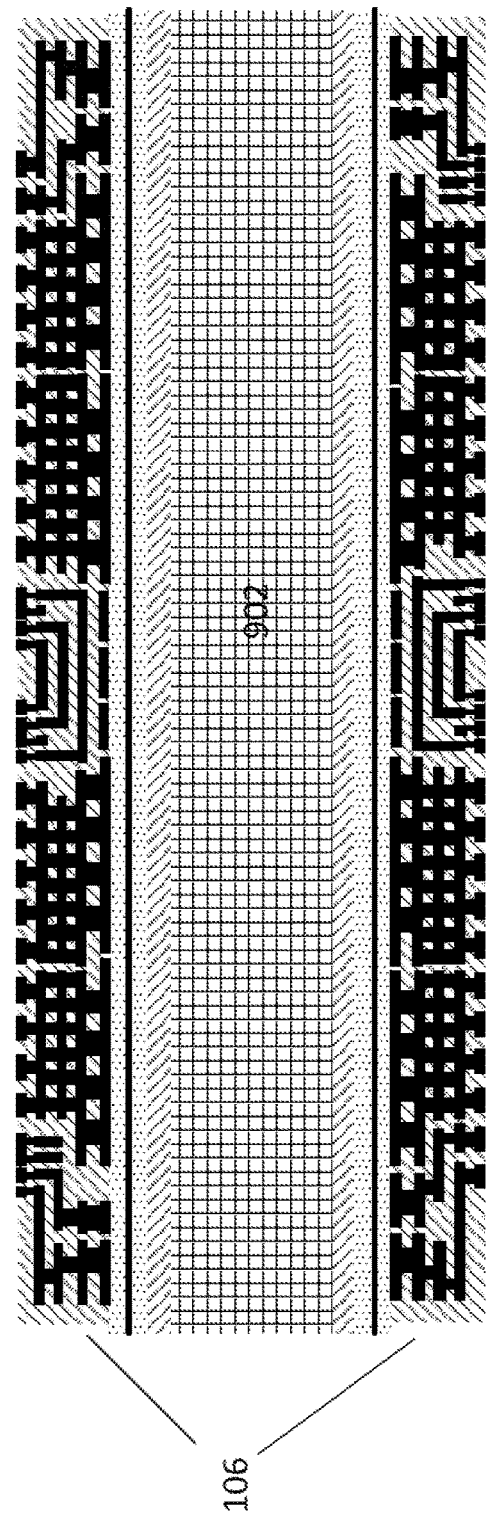
FIG. 10 illustrates a cross-sectional view of a manufacturing step of a multi-chip package with high density interconnects, according to some embodiments.

FIG. 10 illustrates a cross-sectional view of a manufacturing step of a multi-chip package with high density interconnects, according to some embodiments. As shown, substrates 106 have been built up on peelable carrier 902. Organic dielectric layers may be iteratively built up along with voids being formed to accept copper plating and depositing.

Figure 11:
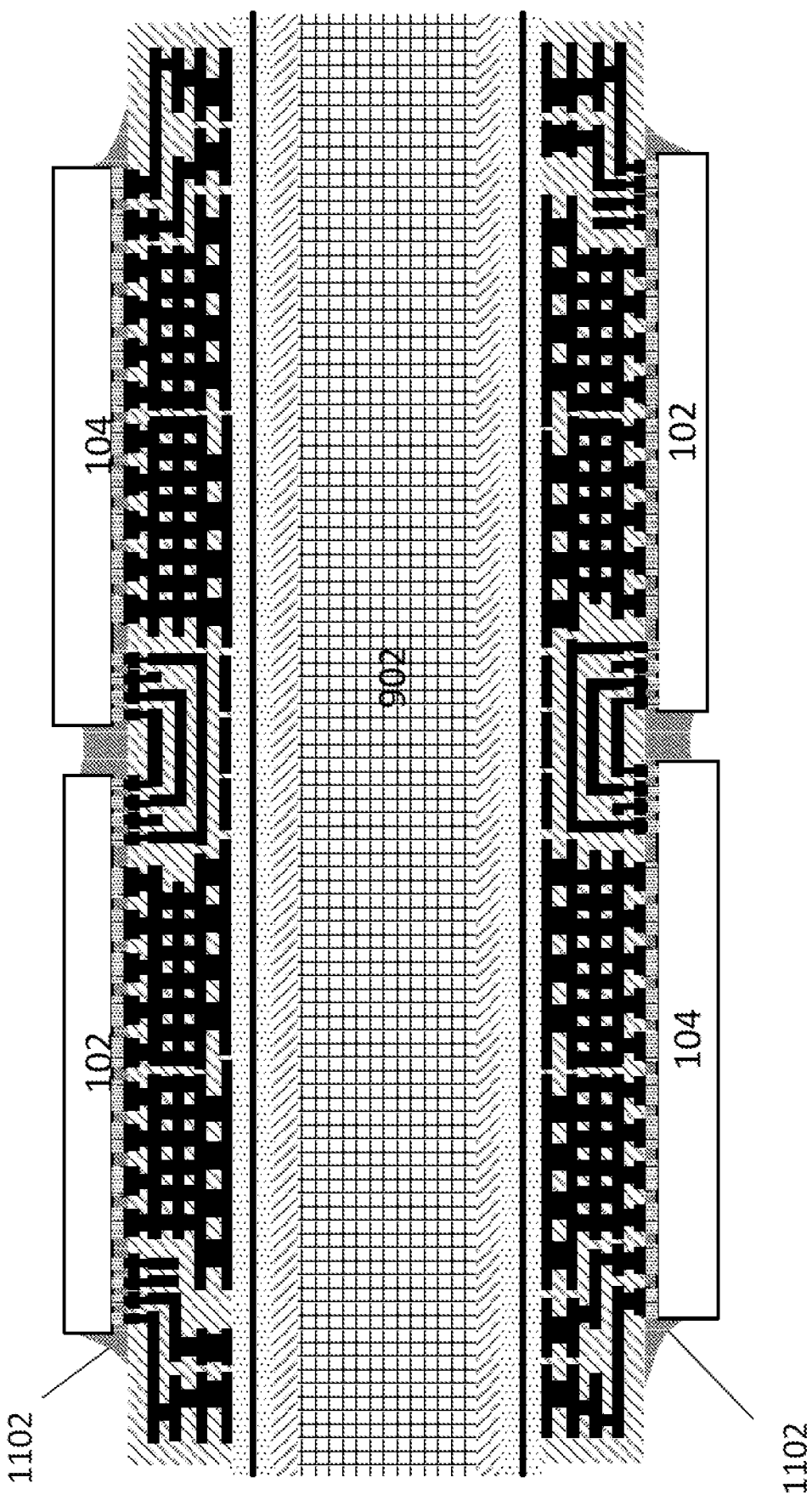
FIG. 11 illustrates a cross-sectional view of a manufacturing step of a multi-chip package with high density interconnects, according to some embodiments.

FIG. 11 illustrates a cross-sectional view of a manufacturing step of a multi-chip package with high density interconnects, according to some embodiments. As shown, dies 102 and 104 have been attached and underfill 1102 has been added. Dies 102 and 104 may have been previously tested and known good. By placing dies 102 and 104 late in the manufacturing process, there is a lessened risk of yield loss.

Figure 12:
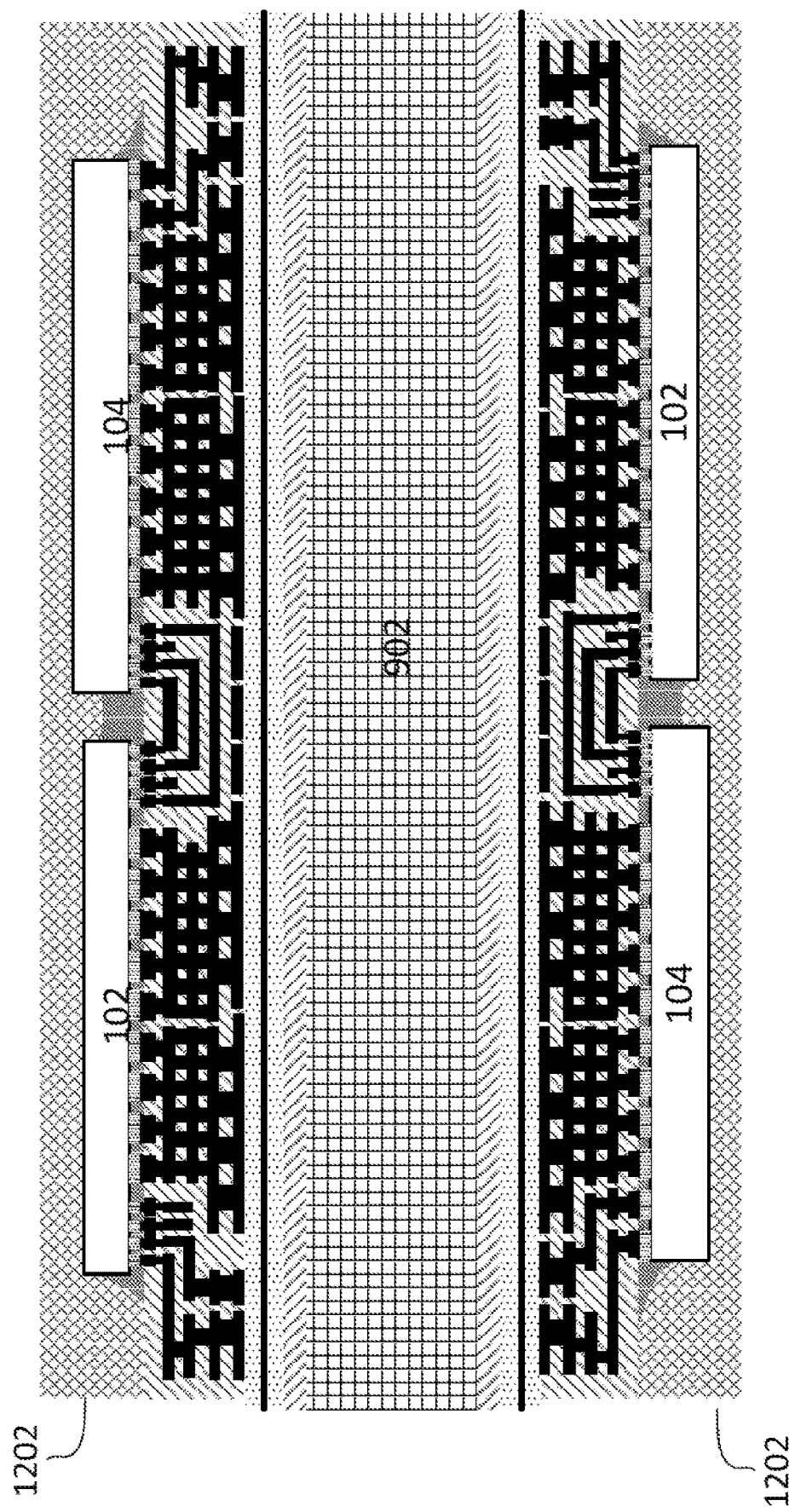
FIG. 12 illustrates a cross-sectional view of a manufacturing step of a multi-chip package with high density interconnects, according to some embodiments.

FIG. 12 illustrates a cross-sectional view of a manufacturing step of a multi-chip package with high density interconnects, according to some embodiments. As shown, mold compound 1202 has been added over the top of dies 102 and 104. In some embodiments, mold 1202 is not used. Mold compound 1202 may selectively be removed, as necessary to expose the top surfaces of dies 102 or 104.

FIG. 13 illustrates a cross-sectional view of a manufacturing step of a multi-chip package with high density interconnects, according to some embodiments. As shown, multi-chip package 100 includes sacrificial layer 906 after being separated from peelable carrier 902.

FIG. 14 illustrates a cross-sectional view of a multi-chip package with high density interconnects, according to some embodiments. As shown, multi-chip package 100 has had sacrificial layer 906 removed. A selective removal process to only remove sacrificial layer 906 without undue risk of yield loss for multi-chip package 100 is recommended. For example, where sacrificial layer 906 is copper, a copper etch will stop at an organic dielectric layer with a selective etchant.

FIG. 15 illustrates a cross-sectional view of a multi-chip package with high density interconnects, according to some embodiments. As shown, multi-chip package 100 includes bottom contacts 112. While shown as bumps, such as in a ball grid array (BGA) solution, in some embodiments bumps are not necessary, for example if multi-chip package 100 is to be coupled in a socket, such as in a land grid array (LGA) solution.

Figure 16:
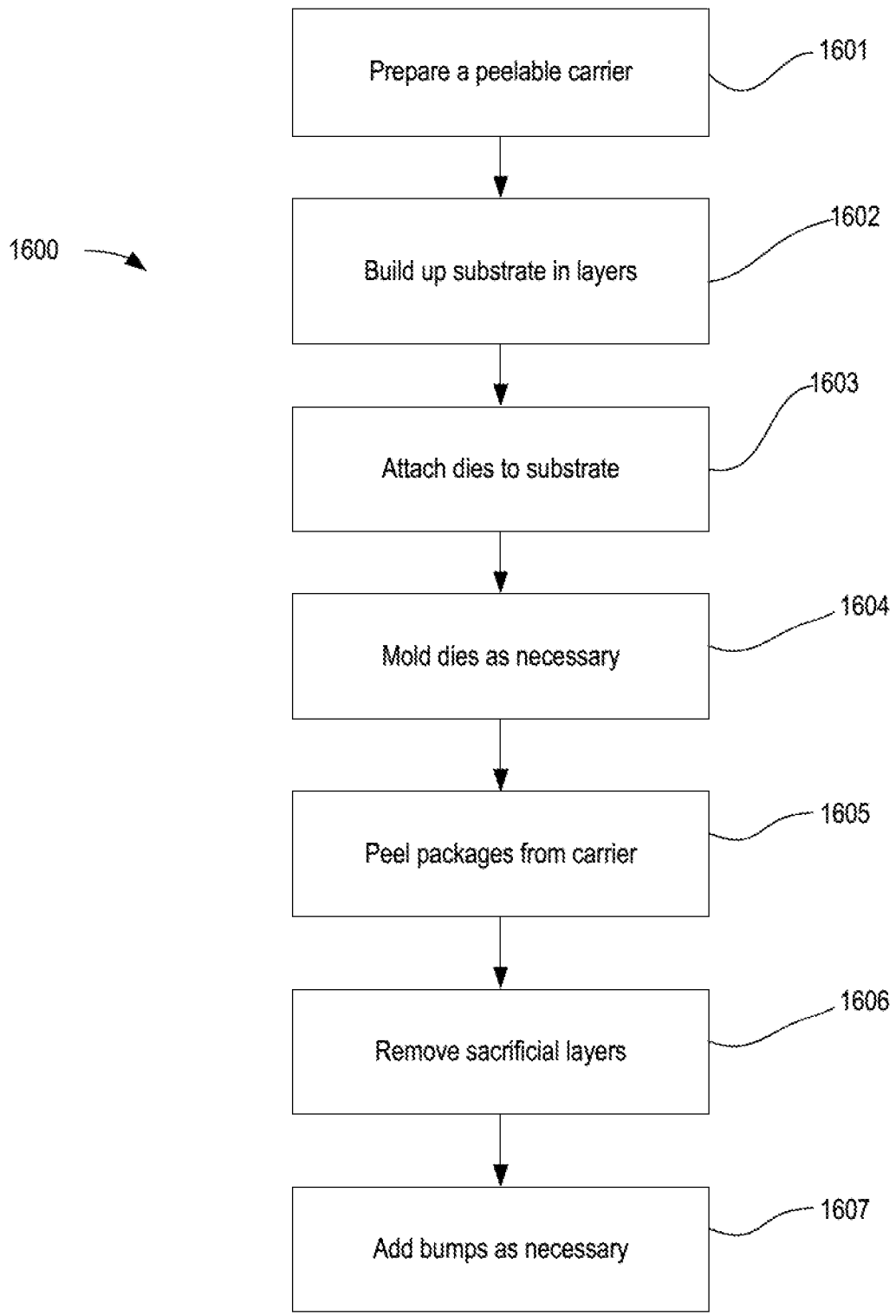
FIG. 16 illustrates a flowchart of a method of forming a multi-chip package with high density interconnects, in accordance with some embodiments.

FIG. 16 illustrates a flowchart of a method of forming a multi-chip package with high density interconnects, in accordance with some embodiments. Although the blocks in the flowchart with reference to FIG. 16 are shown in a particular order, the order of the actions can be modified. Thus, the illustrated embodiments can be performed in a different order, and some actions/blocks may be performed in parallel. Some of the blocks and/or operations listed in FIG. 16 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 1600 begins with preparing (1601) peelable carrier 902. In some embodiments, separate tacky layers 904 and sacrificial layers 906 are disposed on a panel that is being reused. Next, substrates 106 are built up (1602) on the sacrificial layers 906. In some embodiments, the iterative forming of organic dielectric layers with copper interconnects includes three or more layers, including two layers for high density interconnects.

Then, dies 102 and 104 are attached (1603) to the substrates 106 at die sites such that fine pitch contacts and coarse pitch contacts on the bottom of the dies couple with fine pitch contacts and coarse pitch contacts on the top of the substrate, respectively. In some embodiments, underfill 1102 is used to provide stability and protection to the contacts.

Next, in some embodiments, mold compound 1202 is formed (1604) over dies 102 and 104. In some embodiments, mold compound 1202 may subsequently be removed above a top surface of one or more of dies 102 or 104, so that additional dies, such as 402, can be stacked or so that a thermal solution, such as 502, can be utilized, for example.

The method continues with peeling (1605) multi-chip package 100 from carrier 902. In some embodiments, where multiple substrates 106 were formed contiguously, separation of multi-chip packages 100 would also take place. Next, sacrificial layer 906 would be removed (1606) to expose bottom contacts of substrate 106. Finally, to the extent they are necessary, bumps, such as ball grid array (BGA) bumps, would be added (1607) to the bottom of multi-chip package 100.

Figure 17:
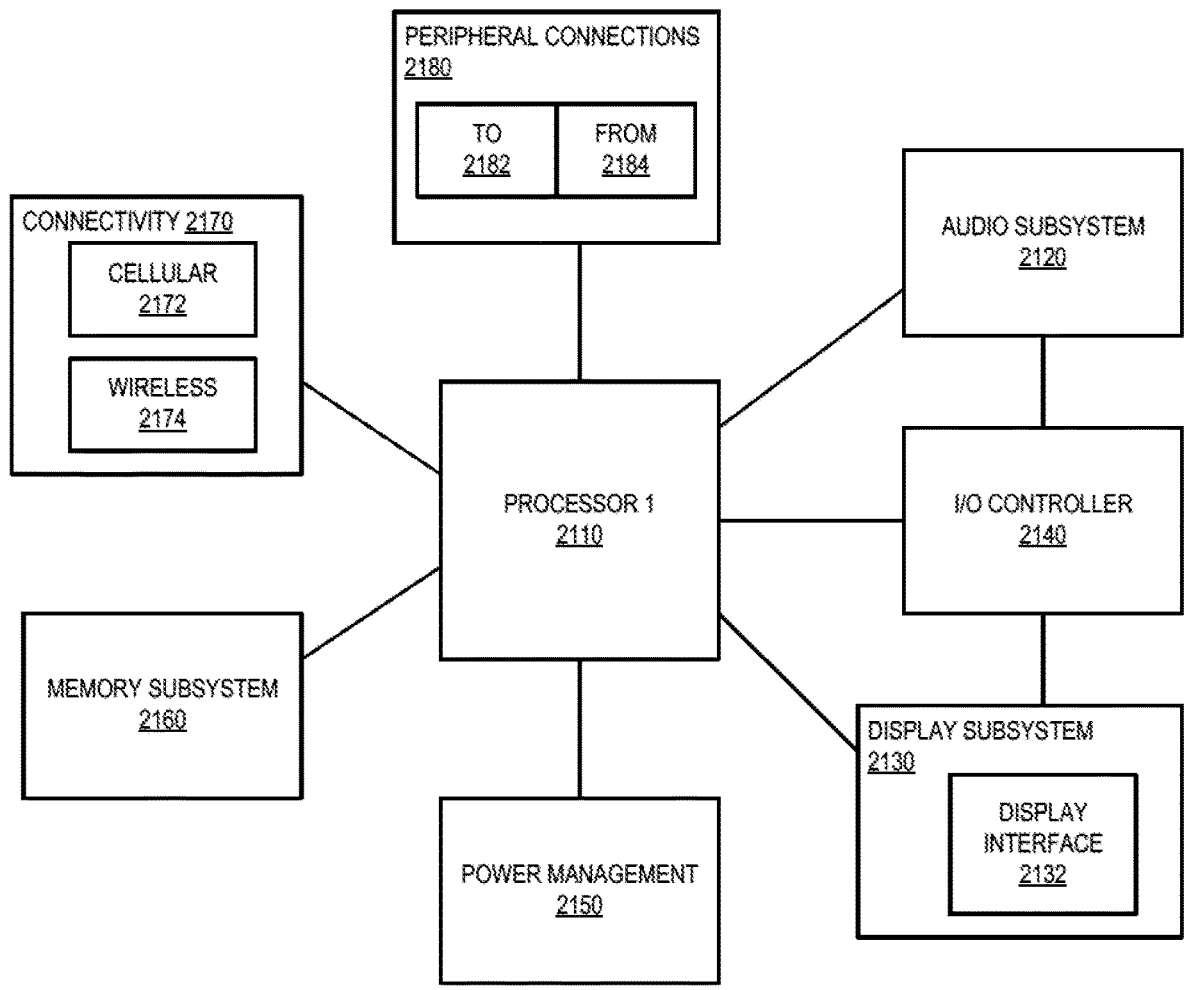
FIG. 17 illustrates a smart device or a computer system or a SoC (System-on-Chip) which includes a multi-chip package with high density interconnects, according to some embodiments.

FIG. 17 illustrates a smart device or a computer system or a SoC (System-on-Chip) 2100 which includes a multi-chip package with high density interconnects, according to some embodiments. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100. In some embodiments, multiple components of computing device 2100, for example processor 2110 and memory subsystem 2160, are included in a multi-chip package with high density interconnects as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided comprising: a plurality of organic dielectric layers forming a substrate; a plurality of first conductive contacts having a first pitch spacing on a top surface of the substrate; a plurality of second conductive contacts having a second pitch spacing on the top surface of the substrate; a plurality of first conductive interconnects disposed within the substrate to couple the plurality of first conductive contacts on the top surface of the substrate with a plurality of conductive contacts having a third pitch spacing on a bottom surface of the substrate; and a plurality of second conductive interconnects disposed within the substrate to couple a first linearly arranged grouping of the plurality of second conductive contacts associated with a first die site with a first linearly arranged grouping of the plurality of second conductive contacts associated with a second die site and to couple a second linearly arranged grouping of the plurality of second conductive contacts associated with the first die site with a second linearly arranged grouping of the plurality of second conductive contacts associated with the second die site, wherein the conductive interconnects to couple the first linearly arranged groupings are present in a layer of the substrate above the conductive interconnects to couple the second linearly arranged groupings along an imaginary reference line orthogonal to the top surface of the substrate.

In some embodiments, apparatus further comprises a plurality of second conductive interconnects disposed within the substrate to couple a third linearly arranged grouping of the plurality of second conductive contacts associated with the first die site with a first linearly arranged grouping of the plurality of second conductive contacts associated with a third die site. In some embodiments, the apparatus further comprises wherein the first and third linearly arranged groupings of the plurality of second conductive contacts associated with the first die site are on a same side of the first die site and are separated by a plurality of first conductive contacts. In some embodiments, the conductive interconnects to couple the first linearly arranged groupings comprise signal traces and the conductive interconnects to couple the second linearly arranged groupings comprise one or more conductive sheets. In some embodiments, the apparatus further comprises third and fourth linearly arranged groupings of the plurality of second conductive contacts associated with the first and second die sites coupled by a plurality of second conductive interconnects disposed within adjacent layers in the substrate. In some embodiments, each die site is coupled with one or more dies. In some embodiments, the plurality of conductive contacts having a third pitch spacing on the bottom surface of the substrate comprise ball grid array (BGA) contacts.

In another example, an apparatus is provided comprising: a plurality of integrated circuit dies; and a substrate, wherein the substrate comprises: top surface contacts arranged as coupling sites for the plurality of integrated circuit dies, wherein at least one coupling site contains at least a first contact pitch and a second contact pitch higher than the first contact pitch; bottom surface contacts at a third contact pitch, wherein the third contact pitch is lower than the first contact pitch; and interconnects embedded within organic dielectric material, wherein the interconnects couple some of the top surface contacts with the bottom surface contacts and couple linearly arranged groupings of the top surface contacts having the second contact pitch along sides of a plurality of coupling sites with linearly arranged groupings of the top surface contacts along sides of adjacent coupling sites, wherein the interconnects further couple inner linearly arranged groupings of top surface contacts of adjacent coupling sites by extending deeper within the organic dielectric material.

In some embodiments, one or more of the integrated circuit dies coupled with the substrate at a coupling site further comprises a vertical stack of dies. In some embodiments, the vertical stack of dies comprises a high bandwidth memory (HBM) stack. In some embodiments, the apparatus further comprises two or more integrated circuit dies coupled by interconnects within the surface of the substrate to a same side of a larger integrated circuit die. In some embodiments, the apparatus further comprises bottom surface contacts fanned out from top surface contacts such at least one bottom surface contact is present along an imaginary reference line orthogonal to the top surface of the substrate, the reference line bisecting layers of interconnects coupling adjacent integrated circuit dies.

In another example a system is provided comprising: a display subsystem; a wireless communication interface; and a multi-chip package, the multi-chip package comprising: one or more processor dies; one or more memory dies; and a substrate coupled with the processor and memory dies, wherein the substrate comprises: top surface contacts arranged as coupling sites for the processor and memory dies, wherein at least one coupling site contains at least a first contact pitch and a second contact pitch higher than the first contact pitch; bottom surface contacts at a third contact pitch, wherein the third contact pitch is lower than the first contact pitch; and interconnects embedded within organic dielectric material, wherein the interconnects couple some of the top surface contacts with the bottom surface contacts and couple linearly arranged groupings of the top surface contacts having the second contact pitch along sides of a plurality of coupling sites with linearly arranged groupings of the top surface contacts along sides of adjacent coupling sites, wherein the interconnects further couple inner linearly arranged groupings of top surface contacts of adjacent coupling sites by extending deeper within the organic dielectric material.

In some embodiments, the system further comprises two adjacent processor dies coupled together along flanking sides by high density interconnects within the substrate. In some embodiments, the system further comprises two memory dies coupled by high density interconnects within the substrate with one processor die along a same side. In some embodiments, the system further comprises a third memory die coupled by high density interconnects within the substrate with the processor die along a different side. In some embodiments, one of more of the memory dies comprises a vertical stack of HBM. In some embodiments, the interconnects further comprise a ground plane within the substrate in a layer below signal traces.

In another example a method is provided comprising: forming a substrate on a peelable carrier, the substrate comprising: a plurality of organic dielectric layers; a plurality of first conductive contacts having a first pitch spacing on a top surface of the substrate; a plurality of second conductive contacts having a second pitch spacing on the top surface of the substrate; a plurality of first conductive interconnects disposed within the substrate to couple the plurality of first conductive contacts on the top surface of the substrate with a plurality of conductive contacts having a third pitch spacing on a bottom surface of the substrate; and a plurality of second conductive interconnects disposed within the substrate to couple a first linearly arranged grouping of the plurality of second conductive contacts associated with a first die site with a first linearly arranged grouping of the plurality of second conductive contacts associated with a second die site and to couple a second linearly arranged grouping of the plurality of second conductive contacts associated with the first die site with a second linearly arranged grouping of the plurality of second conductive contacts associated with the second die site, wherein the conductive interconnects to couple the first linearly arranged groupings are present in a layer of the substrate above the conductive interconnects to couple the second linearly arranged groupings along an imaginary reference line orthogonal to the top surface of the substrate; and attaching integrated circuit dies to the die sites on the substrate.

In some embodiments, the method further comprises forming multiple substrates on both sides of the peelable carrier. In some embodiments, attaching integrated circuit dies further comprises attaching a stack of HBM dies. In some embodiments, the conductive interconnects to couple the first linearly arranged groupings comprise signal traces and the conductive interconnects to couple the second linearly arranged groupings comprise one or more conductive sheets. In some embodiments, the method further comprises covering the dies with a mold compound. In some embodiments, the method further comprises removing the mold compound from above a top surface of at least one die. In some embodiments, the method further comprises: peeling multi-chip packages from the carrier; removing sacrificial layers; and forming bumps over the conductive contacts on the bottom surface of the substrate. In another example an apparatus is produced from any of the above methods. In another example, an apparatus is provided which comprises means to perform any of the above methods.

In another example, a multi-chip package substrate with high density interconnects is provided which comprises: means of forming a substrate; a plurality of first conductive means having a first pitch spacing on a top surface of the substrate; a plurality of second conductive means having a second pitch spacing on the top surface of the substrate; a plurality of first conductive interconnect means disposed within the substrate to couple the plurality of first conductive means on the top surface of the substrate with a plurality of conductive means having a third pitch spacing on a bottom surface of the substrate; and a plurality of second conductive interconnect means disposed within the substrate to couple a first linearly arranged grouping of the plurality of second conductive means associated with a first die site with a first linearly arranged grouping of the plurality of second conductive means associated with a second die site and to couple a second linearly arranged grouping of the plurality of second conductive means associated with the first die site with a second linearly arranged grouping of the plurality of second conductive means associated with the second die site, wherein the conductive interconnect means to couple the first linearly arranged groupings are present in a layer of the substrate above the conductive interconnects to couple the second linearly arranged groupings along an imaginary reference line orthogonal to the top surface of the substrate.

In some embodiments, the multi-chip package substrate further comprises a plurality of second conductive interconnect means disposed within the substrate to couple a third linearly arranged grouping of the plurality of second conductive means associated with the first die site with a first linearly arranged grouping of the plurality of second conductive means associated with a third die site. In some embodiments, the multi-chip package substrate further comprises wherein the first and third linearly arranged groupings of the plurality of second conductive means associated with the first die site are on a same side of the first die site and are separated by a plurality of first conductive means. In some embodiments, the conductive interconnect means to couple the first linearly arranged groupings comprise signal traces and the conductive interconnect means to couple the second linearly arranged groupings comprise one or more conductive sheets. In some embodiments, the multi-chip package substrate further comprises third and fourth linearly arranged groupings of the plurality of second conductive means associated with the first and second die sites coupled by a plurality of second conductive interconnects disposed within adjacent layers in the substrate. In some embodiments, each die site is coupled with one or more dies. In some embodiments, the plurality of conductive means having a third pitch spacing on the bottom surface of the substrate comprise ball grid array (BGA) contacts.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. A system, comprising:
a multi-chip package, comprising:
a substrate having a top side opposite a bottom side, the substrate having a lateral width;
a first die coupled to the top side of the substrate by a first plurality of contacts;
a second die coupled to the top side of the substrate by a second plurality of contacts, the second die laterally spaced apart from the first die, and the second die having a thickness different than a thickness of the first die;
a first plurality of interconnects in the substrate, the first plurality of interconnects comprising horizontal portions and vertical portions;
a second plurality of interconnects in the substrate, the second plurality of interconnects comprising a first interconnect in a first sub-surface layer of the substrate and coupling an outermost contact of the first plurality of contacts to an outermost contact of the second plurality of contacts, and the second plurality of interconnects comprising a second interconnect in a second sub-surface layer of the substrate, the second sub-surface layer beneath the first sub-surface layer, and the second interconnect coupling a next outermost contact of the first plurality of contacts to a next outermost contact of the second plurality of contacts; and
a mold compound laterally adjacent to and between the first die and the second die;
an interposer having a top side opposite a bottom side, wherein the bottom side of the substrate of the multi-chip package is coupled to the top side of the interposer, and wherein the interposer has a lateral width greater than the lateral width of the substrate; and
a printed circuit board having a top side opposite a bottom side, wherein the bottom side of the interposer is coupled to the top side of the printed circuit board.

2. The system of claim 1, wherein the substrate comprises multiple organic layers.

3. The system of claim 1, wherein the second die is a die stack.

4. The system of claim 1, wherein the second plurality of interconnects does not extend through the substrate.

5. The system of claim 1, wherein the mold compound extends to edges of the substrate.

6. The system of claim 1, wherein the second plurality of interconnects comprise a third interconnect in a third sub-surface layer of the substrate, the third sub-surface layer beneath the second sub-surface layer, and the third interconnect coupling a next to next outermost contact of the first plurality of contacts to a next to next outermost contact of the second plurality of contacts.

7. The system of claim 6, wherein the second plurality of interconnects comprise a fourth interconnect in a fourth sub-surface layer of the substrate, the fourth sub-surface layer beneath the third sub-surface layer, and the fourth interconnect coupling a next to next to next outermost contact of the first plurality of contacts to a next to next to next outermost contact of the second plurality of contacts.

8. The system of claim 1, wherein the first plurality of interconnects has a pitch less than a pitch of interconnects in the interposer.

9. A system, comprising:
a multi-chip package, comprising:
a substrate having a top side opposite a bottom side, the substrate having a lateral width;

a die coupled to the top side of the substrate by a first plurality of contacts;

a die stack coupled to the top side of the substrate by a second plurality of contacts, the die stack laterally spaced apart from the die, and the die stack having a bottommost die having a thickness different than a thickness of the die;

a first interconnect extending through the substrate;

a second interconnect in a first sub-surface layer of the substrate, wherein the second interconnect does not extend through the substrate, the second interconnect coupling an outermost contact of the first plurality of contacts to an outermost contact of the second plurality of contacts from a cross-sectional perspective;

a third interconnect in a second sub-surface layer of the substrate, the second sub-surface layer beneath the first sub-surface layer, wherein the third interconnect does not extend through the substrate, and the third interconnect coupling a next outermost contact of the first plurality of contacts to a next outermost contact of the second plurality of contacts from the cross-sectional perspective;

a fourth interconnect in a third sub-surface layer of the substrate, the third sub-surface layer beneath the second sub-surface layer, wherein the fourth interconnect does not extend through the substrate, and the fourth interconnect coupling a next to next outermost contact of the first plurality of contacts to a next to next outermost contact of the second plurality of contacts from the cross-sectional perspective; and a mold compound laterally adjacent to and between the die and the second die; and an interposer having a top side opposite a bottom side, wherein the bottom side of the substrate of the multi-chip package is coupled to the top side of the interposer, and wherein the interposer has a lateral width greater than the lateral width of the substrate.

10. The system of claim 9, wherein the substrate comprises multiple organic layers, and wherein the mold compound extends to edges of the substrate.

11. The system of claim 9, further comprising a fifth interconnect in a fourth sub-surface layer of the substrate, the fourth sub-surface layer beneath the third sub-surface layer, wherein the fourth interconnect does not extend through the substrate, and the fourth interconnect coupling a next to next to next outermost contact of the first plurality of contacts to a next to next to next outermost contact of the second plurality of contacts.

12. The system of claim 9, wherein the first plurality of interconnects has a pitch less than a pitch of interconnects in the interposer.

13. A method of fabricating a system, the method comprising:

forming a multi-chip package, comprising:
a substrate having a top side opposite a bottom side, the substrate having a lateral width;
a first die coupled to the top side of the substrate by a first plurality of contacts;
a second die coupled to the top side of the substrate by a second plurality of contacts, the second die laterally spaced apart from the first die, and the second die having a thickness different than a thickness of the first die;
a first plurality of interconnects in the substrate, the first plurality of interconnects comprising horizontal portions and vertical portions;
a second plurality of interconnects in the substrate, the second plurality of interconnects comprising a first interconnect in a first sub-surface layer of the substrate and coupling an outermost contact of the first plurality of contacts to an outermost contact of the second plurality of contacts, and the second plurality of interconnects comprising a second interconnect in a second sub-surface layer of the substrate, the second sub-surface layer beneath the first sub-surface layer, and the second interconnect coupling a next outermost contact of the first plurality of contacts to a next outermost contact of the second plurality of contacts; and
a mold compound laterally adjacent to and between the first die and the second die;
coupling an interposer to the substrate, the interposer having a top side opposite a bottom side, wherein the bottom side of the substrate of the multi-chip package is coupled to the top side of the interposer, and wherein the interposer has a lateral width greater than the lateral width of the substrate; and
coupling a printed circuit board to the interposer, the printed circuit board having a top side opposite a bottom side, wherein the bottom side of the interposer is coupled to the top side of the printed circuit board.

14. The method of claim 13, wherein the substrate comprises multiple organic layers.

15. The method of claim 13, wherein the second die is a die stack.

16. The method of claim 13, wherein the second plurality of interconnects does not extend through the substrate.

17. The method of claim 13, wherein the mold compound extends to edges of the substrate.

18. The method of claim 13, wherein the second plurality of interconnects comprise a third interconnect in a third sub-surface layer of the substrate, the third sub-surface layer beneath the second sub-surface layer, and the second interconnect coupling a next to next outermost contact of the first plurality of contacts to a next to next outermost contact of the second plurality of contacts.

19. The method of claim 18, wherein the second plurality of interconnects comprise a fourth interconnect in a fourth sub-surface layer of the substrate, the fourth sub-surface layer beneath the third sub-surface layer, and the second interconnect coupling a next to next to next outermost contact of the first plurality of contacts to a next to next to next outermost contact of the second plurality of contacts.

20. The method of claim 13, wherein the first plurality of interconnects has a pitch less than a pitch of interconnects in the interposer.

* * * * *